United States Patent
Kim et al.

(10) Patent No.: US 9,541,675 B2
(45) Date of Patent: Jan. 10, 2017

(54) PHOTOSENSITIVE RESIN COMPOSITION, LIGHT BLOCKING LAYER USING THE SAME, AND COLOR FILTER

(71) Applicant: Samsung SDI Co., Ltd., Yongin-si (KR)

(72) Inventors: Ji-Hye Kim, Suwon-si (KR); Chang-Min Lee, Suwon-si (KR); Kyung-Hee Hyung, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 196 days.

(21) Appl. No.: 14/475,696

(22) Filed: Sep. 3, 2014

(65) Prior Publication Data

US 2015/0241600 A1    Aug. 27, 2015

(30) Foreign Application Priority Data

Feb. 24, 2014    (KR) ........................ 10-2014-0021434

(51) Int. Cl.
*G02B 5/23* (2006.01)
*G02B 1/04* (2006.01)
G02F 1/1335 (2006.01)
C08G 77/04 (2006.01)

(52) U.S. Cl.
CPC .. *G02B 1/04* (2013.01); *G02B 5/23* (2013.01)

(58) Field of Classification Search
USPC ...... 252/582, 586; 349/106; 359/885; 430/7, 430/270.1, 281.1, 321
See application file for complete search history.

(56) References Cited

U.S. PATENT DOCUMENTS

| | | |
|---|---|---|
| 5,998,091 A | 12/1999 | Suzuki |
| 2013/0126217 A1 | 5/2013 | Yamaguchi et al. |

FOREIGN PATENT DOCUMENTS

| | | |
|---|---|---|
| JP | 07-140654 | 6/1995 |
| JP | 10-221848 A | 8/1998 |
| JP | 10-254133 | 9/1998 |
| JP | 4004826 B2 | 11/2007 |
| JP | 2009-167245 A | 7/2009 |
| JP | 2010-024434 A | 2/2010 |
| JP | 4756963 B2 | 8/2011 |
| JP | 5033430 B2 | 9/2012 |
| JP | 5034616 B2 | 9/2012 |
| KR | 10-1992-7002502 | 9/1992 |
| KR | 10-1993-7000858 | 3/1993 |
| KR | 10-1994-0005617 A1 | 6/1994 |
| KR | 10-1995-7000359 | 1/1995 |
| KR | 10-1995-0011163 A1 | 9/1995 |
| KR | 10-1995-7003746 | 9/1995 |
| KR | 10-1999-0060188 A | 7/1999 |
| KR | 10-2001-0061241 A | 7/2001 |
| KR | 10-1996-0029904 A1 | 5/2004 |
| KR | 10-0750331 B1 | 8/2007 |
| KR | 10-2008-0031564 A | 4/2008 |
| KR | 10-1296851 B1 | 8/2013 |
| KR | 10-2013-0106777 A | 9/2013 |
| TW | 201407282 | 2/2014 |
| WO | 91/20006 | 12/1991 |
| WO | 92/14172 | 8/1992 |
| WO | 94/14892 | 7/1994 |
| WO | 95/02839 | 1/1995 |
| WO | 2011/132408 A1 | 10/2011 |

OTHER PUBLICATIONS

Search Report in counterpart Taiwanese Application No. 103132884 dated Feb. 19, 2016, p. 1.

*Primary Examiner* — Bijan Ahvazi
(74) *Attorney, Agent, or Firm* — Additon, Higgins & Pendleton, P.A.

(57) ABSTRACT

Disclosed are a photosensitive resin composition including (A) a copolymer resin represented by the following Chemical Formula 1, wherein in Chemical Formula 1, each substituent is the same as defined in the detailed description; (B) a colorant including a pigment dispersion solution; (C) a photopolymerizable compound; (D) a photopolymerization initiator; and (E) a solvent, and a color filter using the same.

[Chemical Formula 1]

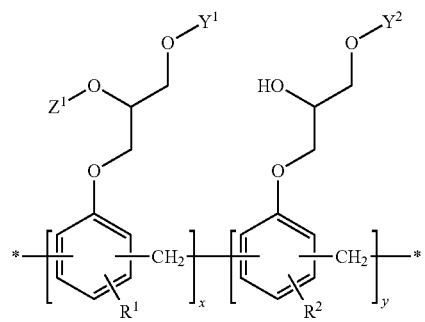

13 Claims, No Drawings

PHOTOSENSITIVE RESIN COMPOSITION, LIGHT BLOCKING LAYER USING THE SAME, AND COLOR FILTER

CROSS-REFERENCE TO RELATED APPLICATION

This application claims priority to and the benefit of Korean Patent Application No. 10-2014-0021434 filed in the Korean Intellectual Property Office on Feb. 24, 2014, the entire disclosure of which is incorporated herein by reference.

FIELD OF THE INVENTION

This disclosure relates to a photosensitive resin composition, and a light blocking layer and a color filter using the same.

BACKGROUND

Color filters are used for liquid crystal displays (LCDs), optical filters for cameras, and the like. Color filters may be manufactured by coating a fine region colored with three or more colors on a charge coupled device or a transparent substrate. This colored thin film can be manufactured using a method of dyeing, printing, electrophoretic deposition (EPD), pigment dispersion, and the like.

The pigment dispersion method forms a colored film by repeating a series of processes such as coating, exposing to light, developing, and thermally curing a photopolymer composition including a colorant on a transparent substrate including a black matrix. This method may improve heat resistance and durability, which are very important characteristics for a color filter, and may provide a uniform film thickness. For example, Korean Patent Laid-Open No. 1992-7002502, Korean Patent Laid-Open No. 1995-7000359, Korean Patent Publication No. 1994-0005617 and Korean Patent Laid-Open Publication No. 1995-0011163, and the like disclose a method of manufacturing a photosensitive resin composition for a color filter using a pigment dispersion method.

The color filter is prepared through many chemical treatments during the manufacturing process. Accordingly, in order to maintain a pattern formed under the aforementioned conditions, a color photosensitive resin is required to have a development margin but chemical resistance to improve yield of a color filter.

In particular, a conventional color liquid crystal display (LCD) is generally fabricated by preparing a color filter substrate for displaying a color image differently from an operating substrate on which TFT is disposed and then binding the color filter substrate and the operating substrate together. However, since they have low arrangement accuracy during the binding, they require a shading layer with a large width. Accordingly, it is difficult to increase its aperture ratio (a ratio of an opening to transmit light).

Also, as the glass substrates of LCDs and LCD screens have recently become larger, it takes a longer time for a liquid crystal composition to be disposed over the front side of the substrates during vacuum injection of a liquid crystal. Accordingly, a new method has been suggested to sharply decrease the time needed for printing a seal material and dripping a liquid crystal for over-coating; this method, however, has a problem of sharply deteriorating arrangement accuracy.

On the other hand, another method of forming a color filter on the operating TFT array substrate of a TFT color liquid crystal display (LCD) has been suggested. Since this method does not need a color filter substrate and by fabricating a transparent substrate through sputtering and binding two substrates, it has an advantage of simplifying arrangement and increasing an aperture ratio. However, when a color filter is formed on a TFT array substrate, a pixel electrode is formed on the color filter in a photolithography method by using a common positive photoresist. Accordingly, the resist layer needs to be removed after forming the electrode. In other words, a pixel electrode is formed by forming a transparent electrode layer on color pixels of a color filter, coating a positive resist composition thereon, and patterning it, exposing it to light, and developing it. Then, the resist layer remaining on the pixel electrode should be peeled and removed with a resist stripper. Accordingly, the positive resist composition requires resistance for the resist stripper.

A conventional photosensitive resin composition has weak resistance for a resist stripper. According to the conventional art, a pixel electrode is fabricated by forming a transparent layer (a pixel protective layer) having stripper-resistance on a color filter. In addition, a pixel electrode may be manufactured without coating a pixel protective layer by treating a stripper at a low temperature for a longer time to decrease the stripper's influence on a color filter. However, these conventional methods have problems of deteriorating yield rate and production efficiency, since more processes and longer times are required. In particular, the conventional methods can require longer baking times at a high temperature, which can deteriorate a color shift or luminance and can severely shrink a pattern as the pattern is constantly cured by heat.

Accordingly, there is a need for a photosensitive resin composition for manufacturing a color filter having excellent heat resistance and a low shrinkage ratio.

SUMMARY

One embodiment provides a photosensitive resin composition that can have excellent sensitivity, heat resistance and shrinkage resistance.

Another embodiment provides a light blocking layer manufactured using the photosensitive resin composition.

Yet another embodiment provides a color filter including the light blocking layer.

One embodiment provides a photosensitive resin composition including (A) a copolymer resin represented by the following Chemical Formula 1; (B) a colorant including a pigment dispersion solution; (C) a photopolymerizable compound; (D) a photopolymerization initiator; and (E) a solvent.

[Chemical Formula 1]

$$\text{Z}^1\text{O} \underset{\text{O}}{\overset{\text{O-Y}^1}{\diagdown}} \text{O} \underset{\phantom{R^1}}{\underbrace{\left[\phantom{XXX}\right]_x}} \text{CH}_2 \underset{\phantom{R^2}}{\underbrace{\left[\phantom{XXX}\right]_y}} \text{CH}_2 \overset{*}{\phantom{X}}$$

In the above Chemical Formula 1, $R^1$ and $R^2$ are the same or different and are each independently hydrogen or substituted or unsubstituted C1 to C20 alkyl, $Y^1$ and $Y^2$ are the same or different and are each independently represented by the following Chemical Formula 2-1, each $Z^1$ is independently represented by the following Chemical Formula 2-2, x is an integer ranging from 1 to 200, y is an integer ranging from 1 to 200, and x+y≥2.

[Chemical Formula 2-1]

In the above Chemical Formula 2-1, $R^3$ to $R^6$ are the same or different and are each independently hydrogen, halogen, a hydroxy group, a cyano group, substituted or unsubstituted C1 to C20 alkyl, a carboxyl group, a nitro group, a sulfonyl group, or a combination thereof, $R^7$ is hydrogen or substituted or unsubstituted C1 to C20 alkyl, each $L^1$ is independently substituted or unsubstituted C1 to C20 alkylene, and n1 is an integer ranging from 1 to 12.

[Chemical Formula 2-2]

In the above Chemical Formula 2-2,

W is substituted or unsubstituted C1 to C20 alkylene, substituted or unsubstituted C2 to C20 alkenylene, substituted or unsubstituted C1 to C20 heteroalkylene, substituted or unsubstituted C3 to C20 cycloalkylene, substituted or unsubstituted C4 to C20 cycloalkenylene, substituted or unsubstituted C2 to C20 hetero cycloalkylene, or substituted or unsubstituted C6 to C20 arylene.

For example, the $Z^1$ may be represented by one or more of the following Chemical Formula 3 to Chemical Formula 9.

[Chemical Formula 3]

[Chemical Formula 4]

[Chemical Formula 5]

[Chemical Formula 6]

[Chemical Formula 7]

[Chemical Formula 8]

[Chemical Formula 9]

In the above Chemical Formula 3 to Chemical Formula 9, $R^8$ and $R^9$ are the same or different and are each independently hydrogen, substituted or unsubstituted C1 to C20 alkyl, —C(=O)O$R^{10}$ (wherein $R^{10}$ is hydrogen or substituted or unsubstituted C1 to C10 alkyl), —O$R^{11}$ (wherein $R^{11}$ is hydrogen or substituted or unsubstituted C1 to C10 alkyl), or a combination thereof, and $L^2$ to $L^6$ are the same or different and are each independently a single bond, —O—, —S—, —NH—, or substituted or unsubstituted C1 to C20 alkylene.

For example, $Z^1$ may be represented by the above Chemical Formula 3, Chemical Formula 5, and/or Chemical Formula 6.

A weight average molecular weight of the copolymer resin may be about 3,000 g/mol to about 500,000 g/mol.

An acid value of the copolymer resin may be about 20 mgKOH/g to about 200 mgKOH/g.

The photosensitive resin composition may further include a cardo-based resin, an acrylic-based resin, or a combination thereof.

The colorant may further include a dye.

The photosensitive resin composition may include about 1 wt % to about 50 wt % of the copolymer resin (A) represented by the Chemical Formula 1; about 1 wt % to about 60 wt % of the colorant (B) including a pigment dispersion solution; about 0.5 wt % to about 20 wt % of the photopolymerizable compound (C); about 0.1 wt % to about 10 wt % of the photopolymerization initiator (D); and a balance amount of the solvent (E).

The photosensitive resin composition may further include an additive selected from malonic acid; 3-amino-1,2-propanediol; a silane-based coupling agent having a vinyl group or a (meth)acryloxy group; a leveling agent; a fluorine-based surfactant; a radical polymerization initiator; and a mixture thereof.

Another embodiment provides a light blocking layer manufactured using the photosensitive resin composition.

Yet another embodiment provides a color filter including the light blocking layer.

Other embodiments of the present invention are included in the following detailed description.

The photosensitive resin composition can have excellent sensitivity, heat resistance and shrinkage resistance, and thus may be usefully applied to form a light blocking layer in a color filter, and the like.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" refers to C1 to C20 alkyl, the term "alkenyl" refers to C2 to C20 alkenyl, the term "cycloalkenyl" refers to C3 to C20 cycloalkenyl, the term "heterocycloalkenyl" refers to C3 to C20 heterocycloalkenyl, the term "aryl" refers to C6 to C20, the term "arylalkyl" refers to C6 to C20 arylalkyl, the term "alkylene" refers to C1 to C20 alkylene, the term "arylene" refers to C6 to C20 arylene, the term "alkylarylene" refers to C6 to C20 alkylarylene, the term "heteroarylene" refers to C3 to C20 heteroarylene, and the term "alkoxylene" refers to C1 to C20 alkoxylene.

As used herein, when a specific definition is not otherwise provided, the term "cycloalkenyl" includes "a bicycloalkenyl", and the term "cycloalkenylene" includes "a bicycloalkenylene".

As used herein, when a specific definition is not otherwise provided, the term "substituted" refers to one substituted with one or more substituents including halogen (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, C1 to C20 alkyl, C2 to C20 alkenyl, C2 to C20 alkynyl, C6 to C20 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, C3 to C20 heteroaryl, or a combination thereof, instead of at least one hydrogen.

As used herein, when a specific definition is not otherwise provided, the term "hetero" may refer to one substituted with at least one or more hetero atom of N, O, S and/or P, instead of at least one C in a cyclic substituent.

As used herein, when a specific definition is not otherwise provided, "(meth)acrylate" refers to both "acrylate" and "methacrylate", and "(meth)acrylic acid" refers to both "acrylic acid" and "methacrylic acid".

As used herein, when a specific definition is not otherwise provided, the term "combination" refers to mixing or copolymerization.

As used herein, when a specific definition is not otherwise provided, the cardo-based resin refers to a resin including at least one of linking groups represented by Chemical Formula a to Chemical Formula I in a backbone.

A photosensitive resin composition according to one embodiment includes (A) a copolymer resin represented by the following Chemical Formula 1; (B) a colorant including a pigment dispersion solution; (C) a photopolymerizable compound; (D) a photopolymerization initiator; and (E) a solvent. The copolymer resin is represented by the following Chemical Formula 1 and may variously adjust an acid value unlike a conventional cardo-based resin and can have excellent sensitivity, heat resistance, chemical resistance and shrinkage resistance as well as an excellent developing margin and thus, can provide a photosensitive resin composition realizing a high aperture ratio and a high contrast ratio.

Hereinafter, each component is specifically described.

(A) Copolymer Resin

The copolymer resin is represented by the following Chemical Formula 1.

[Chemical Formula 1]

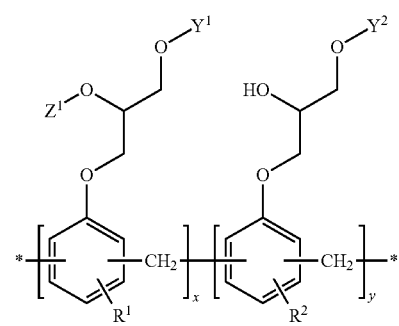

In the above Chemical Formula 1, $R^1$ and $R^2$ are the same or different and are each independently hydrogen or substituted or unsubstituted C1 to C20 alkyl (e.g., substituted or unsubstituted C1 to C6 alkyl), $Y^1$ and $Y^2$ are the same or different and are each independently represented by the following Chemical Formula 2-1, each $Z^1$ is independently represented by the following Chemical Formula 2-2, x is an integer ranging from 1 to 200, y is an integer ranging from 1 to 200, x+y≥2, and x and y are a number of each repeating unit.

[Chemical Formula 2-1]

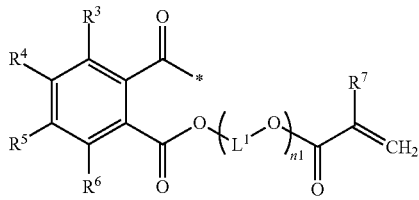

In the above Chemical Formula 2-1, $R^3$ to $R^6$ are the same or different and are each independently hydrogen, halogen, a hydroxy group, a cyano group, substituted or unsubstituted C1 to C20 alkyl (e.g., substituted or unsubstituted C1 to C6 alkyl), a carboxyl group, a nitro group, a sulfonyl group, or a combination thereof, $R^7$ is hydrogen or substituted or unsubstituted C1 to C20 alkyl (e.g., methyl or ethyl), each $L^1$ is independently substituted or unsubstituted C1 to C20 alkylene (e.g., substituted or unsubstituted C1 to C6 alkylene), and n1 is an integer ranging from 1 to 12.

[Chemical Formula 2-2]

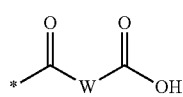

In the above Chemical Formula 2-2,

W is substituted or unsubstituted C1 to C20 alkylene, substituted or unsubstituted C2 to C20 alkenylene, substituted or unsubstituted C1 to C20 heteroalkylene, substituted or unsubstituted C3 to C20 cycloalkylene, substituted or unsubstituted C4 to C20 cycloalkenylene, substituted or unsubstituted C2 to C20 hetero cycloalkylene, substituted or unsubstituted C2 to C20 hetero cycloalkenylene, or substituted or unsubstituted C6 to C20 arylene.

For example, $Z^1$ may be represented by one or more of the following Chemical Formula 3 to Chemical Formula 9.

[Chemical Formula 3]

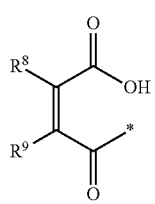

[Chemical Formula 4]

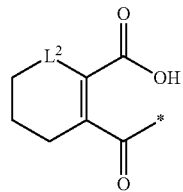

[Chemical Formula 5]

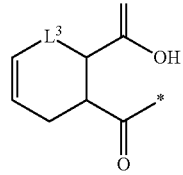

[Chemical Formula 6]

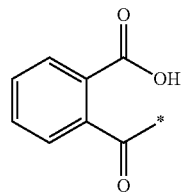

[Chemical Formula 7]

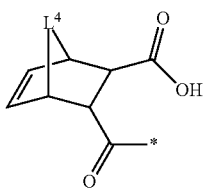

[Chemical Formula 8]

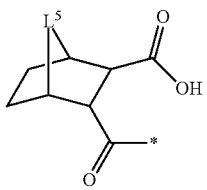

[Chemical Formula 9]

In the above Chemical Formula 3 to Chemical Formula 9, $R^8$ and $R^9$ are the same or different and are each independently hydrogen, substituted or unsubstituted C1 to C20 alkyl, —C(═O)$OR^{10}$ (wherein $R^{10}$ is hydrogen or substituted or unsubstituted C1 to C10 alkyl), —$OR^{11}$ (wherein $R^{11}$ is hydrogen or substituted or unsubstituted C1 to C10 alkyl), or a combination thereof, and $L^2$ to $L^6$ are the same or different and are each independently a single bond, —O—, —S—, —NH—, or substituted or unsubstituted C1 to C20 alkylene.

For example, $Z^1$ may be represented by one or more of the above Chemical Formula 3, Chemical Formula 5, or Chemical Formula 6.

The photosensitive resin composition according to one embodiment includes the copolymer resin represented by the above Chemical Formula 1 and thus, may have excellent sensitivity, heat resistance, chemical resistance and shrinkage resistance. In addition, the photosensitive resin composition may be used to manufacture a light blocking layer having high optical density and a color filter having excellent performance by realizing red, green, and blue resists having high luminance.

The copolymer resin may have a weight average molecular weight of about 3,000 g/mol to about 500,000 g/mol, for example, about 5,000 g/mol to about 50,000 g/mol.

The copolymer resin may have an acid value of about 20 mgKOH/g to about 200 mgKOH/g, for example, about 40 mgKOH/g to about 200 mgKOH/g.

The x may be an integer ranging from about 1 to about 200, the y may be an integer ranging from about 1 to about 200, and x+y≥2.

The x and y may be independently an integer ranging from about 1 to about 100, for example, about 1 to about 50.

When the copolymer resin has a weight average molecular weight, an acid value and a mole ratio of the x and y within the above ranges, excellent heat resistance, developability and shrinkage resistance may be obtained.

The photosensitive resin composition may further include a cardo-based resin, an acrylic-based resin, or a combination thereof.

The cardo-based resin may include a repeating unit represented by the following Chemical Formula 10 and Chemical Formula 11.

each $Z^3$ is independently a residual group of acid dianhydride.

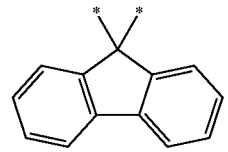
[Chemical Formula a]

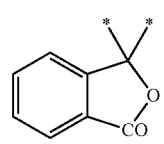
[Chemical Formula b]

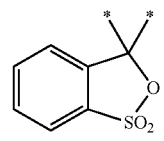
[Chemical Formula c]

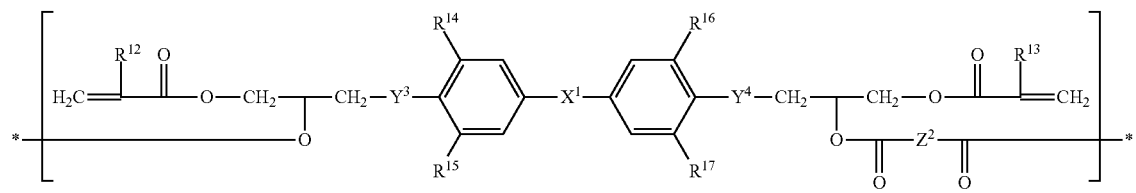
[Chemical Formula 10]

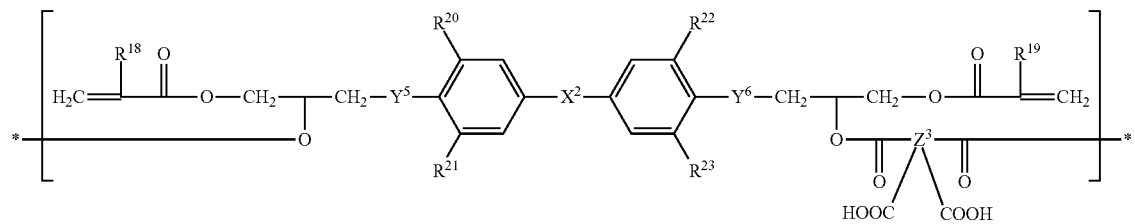
[Chemical Formula 11]

In the above Chemical Formula 10 and Chemical Formula 11, $R^{12}$, $R^{13}$, $R^{18}$ and $R^{19}$ are the same or different and are each independently hydrogen or substituted or unsubstituted C1 to C20 alkyl, $R^{14}$ to $R^{17}$ and $R^{20}$ to $R^{23}$ are the same or different and are each independently hydrogen, halogen, or substituted or unsubstituted C1 to C20 alkyl, $X^1$ and $X^2$ are the same or different and are each independently represented by one of the following Chemical Formula a to Chemical Formula I, $Y^3$ to $Y^6$ are the same or different and are each independently a single bond, —O—, —NR$^{24}$— (wherein $R^{24}$ is hydrogen, methyl, ethyl, CH$_2$OH, C$_2$H$_4$OH or CH$_2$CH=CH$_2$), or —C(=O)O—, each $Z^2$ is independently a residual group of acid anhydride, and -continued

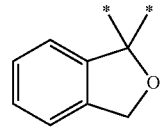
[Chemical Formula d]

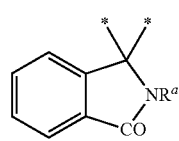
[Chemical Formula e]

In the above Chemical Formula e, $R^a$ is hydrogen, ethyl, C$_2$H$_4$Cl, C$_2$H$_4$OH, CH$_2$CH=CH$_2$, or phenyl.

[Chemical Formula f]

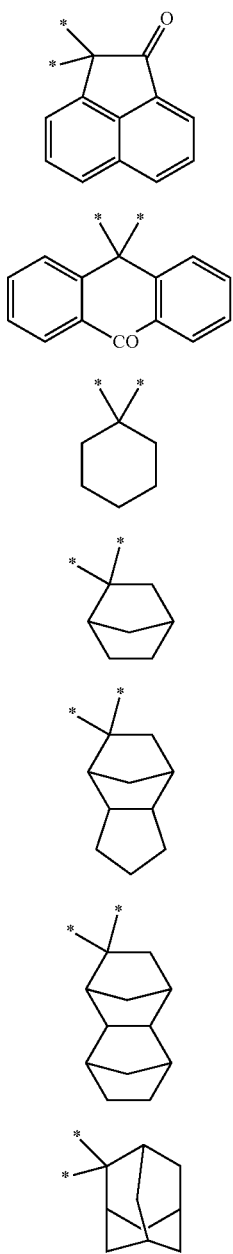

[Chemical Formula g]

[Chemical Formula h]

[Chemical Formula i]

[Chemical Formula j]

[Chemical Formula k]

[Chemical Formula l]

The cardo-based resin may have a weight average molecular weight of about 500 g/mol to about 30,000 g/mol. When the cardo-based resin has a weight average molecular weight within the above range, a pattern may be well formed without a residue and with minimal or no loss of a film thickness during development.

The cardo-based resin may include a terminal group represented by the following Chemical Formula 12 at at least one of the terminal ends.

[Chemical Formula 12]

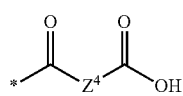

In the above Chemical Formula 12,
$Z^4$ is one of linking groups represented by the following Chemical Formulae 13-1 to 13-7.

[Chemical Formula 13-1]

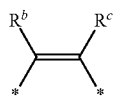

In the above Chemical Formula 13-1,
$R^b$ and $R^c$ are the same or different and are each independently hydrogen, substituted or unsubstituted C1 to C20 alkyl, an ester group, or an ether group.

[Chemical Formula 13-2]

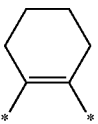

[Chemical Formula 13-3]

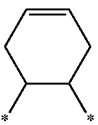

[Chemical Formula 13-4]

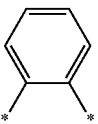

[Chemical Formula 13-5]

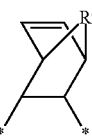

In the above Chemical Formula 13-5,
$R^d$ is O, S, NH, substituted or unsubstituted C1 to C20 alkylene, a C1 to C20 alkylamine, or C2 to C20 allylamine.

[Chemical Formula 13-6]

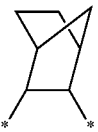

[Chemical Formula 13-7]

The cardo-based resin may be for example prepared by mixing at least two of a fluorene-containing compound such as 9,9-bis(4-oxiranylmethoxyphenyl)fluorene, and the like; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, tetrahydrophthalic anhydride, and the like; a glycol compound such as ethylene glycol, propylene glycol, polyethylene glycol, and the like; an alcohol compound such as methanol, ethanol, propanol, n-butanol, cyclohexanol, benzylalcohol, and the like; a solvent compound such as propylene glycol methylethylacetate, N-methylpyrrolidone, and the like; a phosphorus compound such as triphenylphosphine, and the like; and an amine or ammonium salt compound such as tetramethylammonium chloride, tetraethylammonium bromide, benzyldiethylamine, triethylamine, tributylamine, benzyltriethylammonium chloride, and the like.

The photosensitive resin composition may include the cardo-based resin in an amount of about 0 wt % to about 10 wt % based on the total amount (total weight, 100 wt %) of the photosensitive resin composition.

The acrylic-based resin is a copolymer of a first ethylenic unsaturated monomer and a second ethylenic unsaturated monomer that is copolymerizable with the first ethylenic unsaturated monomer, and is a resin including at least one acrylic-based repeating unit.

The first ethylenic unsaturated monomer is an ethylenic unsaturated monomer including at least one carboxyl group. Examples of the ethylenic unsaturated monomer include without limitation (meth)acrylic acid, maleic acid, itaconic acid, fumaric acid, and the like, and combinations thereof.

The first ethylenic unsaturated monomer may be included in an amount ranging from about 5 wt % to about 50 wt %, for example from about 10 wt % to about 40 wt %, based on the total amount (total weight, 100 wt %) of the acrylic-based resin.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile, and the like; unsaturated amide compounds such as (meth)acrylamide, and the like; and the like. They may be used singularly or as a mixture of two or more.

Examples of the acrylic-based resin may include without limitation an acrylic acid/benzylmethacrylate copolymer, a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethyl methacrylate copolymer, and the like. They may be used singularly or as a mixture of two or more.

The photosensitive resin composition may include the acrylic-based resin in an amount of about 0 wt % to about 10 wt % based on the total amount (total weight, 100 wt %) of the photosensitive resin composition.

When the acrylic-based resin is included in the photosensitive resin composition, the cardo-based resin and the acrylic-based resin may be used in a weight ratio ranging from about 99:1 to about 30:70, for example, about 95:5 to about 50:50. When the cardo-based resin and acrylic-based resin are included in amounts within the above weight ratio range, a light blocking layer pattern having excellent tapering characteristics as well as maintaining excellent developability and sensitivity may be formed, and an undercut may also be prevented.

The photosensitive resin composition may include the copolymer resin (A) represented by Chemical Formula 1 in an amount of about 1 wt % to about 50 wt %, for example about 3 wt % to about 20 wt %, based on the total amount (total weight, 100 wt %) of the photosensitive resin composition. In some embodiments, the photosensitive resin composition may include the copolymer resin (A) represented by Chemical Formula 1 in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the copolymer resin (A) represented by Chemical Formula 1 can be in a range from about any of the foregoing amounts to about any other of the foregoing amounts.

When the copolymer resin (A) represented by Chemical Formula 1 is included in an amount within the above range, excellent sensitivity, heat resistance, chemical resistance and developability may be obtained.

(B) Colorant

The colorant includes a pigment dispersion solution, and the pigment dispersion solution includes a pigment, a dispersing agent, a solvent, and the like. In addition, the colorant may further include a dye.

Examples of the pigment may include without limitation red pigments, green pigments, blue pigments, yellow pigments, violet pigments, black pigments, and the like, and combinations thereof.

Examples of the red pigment may include without limitation C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may include without limitation halogen-substituted copper phthalocyanine pigments such as C.I. green pigment 36, C.I. green pigment 7, and the like. Examples of the blue pigment may include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment may include without limitation isoindoline-based pigments such as C.I. yellow pigment 139, and the like, quinophthalone-based pigments such as C.I. yellow pigment 138, and the like, nickel complex pigments such as C.I. yellow pigment 150, and the like. Examples of the violet-based pigment may include without limitation dioxazine violet, first violet B, methyl violet lake, indanthrene brilliant violet, and the like. Examples of the black pigment may include without limitation aniline black, perylene black, titanium black, carbon black, and the like. The pigment may be used singularly or as a mixture of two or more, but is not limited thereto.

The black pigment may be used so that the light blocking layer may block light efficiently. The black pigment may be used with a color calibrator such as an anthraquinone-based pigment, a perylene-based pigment, a phthalocyanine-based pigment, an azo-based pigment, and the like, or a combination thereof.

The photosensitive resin composition may further include a dispersing agent in order to improve dispersion of the pigment. The pigment may be surface-pretreated with a dispersing agent, or the pigment and dispersing agent may be added together during preparation of the photosensitive resin composition.

The dispersing agent may be a non-ionic dispersing agent, an anionic dispersing agent, a cationic dispersing agent, and the like, or a combination thereof. Examples of the dispersing agent may include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and may be used singularly or as a mixture of two or more.

Commercially available examples of the dispersing agent may include without limitation DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; PB711, PB821, and the like made by Ajinomoto Inc.; and the like, and combinations thereof.

The dispersing agent may be included in an amount of about 0.1 wt % to about 15 wt % based on the total weight of the photosensitive resin composition. When the dispersing agent is included in an amount within the above range, the photosensitive resin composition can have excellent dispersion property and thus, may form a light blocking layer having excellent stability, developability, and pattern-forming capability.

In addition, the dispersing agent may be used additionally along with the first ethylenic unsaturated monomer and the like including a carboxyl group to improve patterning property of pixels as well as stability of a pigment dispersion solution.

The pigment may be pre-treated using a water-soluble inorganic salt and a wetting agent. When the pigment is pre-treated, a primary particle of the pigment may become finer.

The pre-treatment may be performed by kneading the pigment with a water-soluble inorganic salt and a wetting agent and then, filtering and washing the knead pigment.

The kneading may be performed at a temperature ranging from about 40° C. to about 100° C., and the filtering and washing may be performed by filtering the pigment after washing away an inorganic salt with water and the like.

Examples of the water-soluble inorganic salt may include without limitation sodium chloride, potassium chloride, and the like, and combinations thereof. The wetting agent may make the pigment to be uniformly mixed with the water-soluble inorganic salt and be pulverized. Examples of the wetting agent include without limitation alkylene glycol monoalkyl ethers such as ethylene glycol monoethylether, propylene glycol monomethylether, diethylene glycol monomethylether, and the like, and alcohols such as ethanol, isopropanol, butanol, hexanol, cyclohexanol, ethylene glycol, diethylene glycol, polyethylene glycol, glycerine polyethylene glycol, and the like. These may be used singularly or as a mixture of two or more.

The pigment after the kneading may have an average particle diameter ranging from about 5 nm to about 200 nm, for example about 5 nm to about 150 nm. When the pigment has an average particle diameter within the above range, stability in the pigment dispersion solution can be improved, and a pixel resolution may not be deteriorated.

The photosensitive resin composition may include the colorant in an amount of about 1 wt % to about 60 wt %, for example about 5 wt % to about 60 wt %, based on the total amount (total weight, 100 wt %) of photosensitive resin composition. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the colorant can be in a range from about any of the foregoing amounts to about any other of the foregoing amounts.

When the colorant is included in a form of a pigment dispersion solution in the photosensitive resin composition, the pigment of the pigment dispersion solution may be included in an amount of about 0.1 wt % to about 40 wt % based on the total amount (total weight, 100 wt %) of the photosensitive resin composition. In some embodiments, the photosensitive resin composition may include the pigment of the pigment dispersion solution in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment of the pigment dispersion solution can be in a range from about any of the foregoing amounts to about any other of the foregoing amounts.

When the colorant is included in an amount within the above range, coloring effects and development performance can be improved.

(C) Photopolymerizable Compound

The photopolymerizable compound may be a generally-used monomer and/or oligomer in a black photosensitive resin composition. It may be a mono-functional and/or multi-functional ester of (meth)acrylic acid including at least one ethylenic unsaturated double bond.

The photopolymerizable compound has the ethylenic unsaturated double bond and thus may cause sufficient polymerization during exposure in a pattern-forming process and form a pattern having excellent heat resistance, light resistance, and chemical resistance.

Examples of the photopolymerizable compound may include, for example, ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylolpropane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof.

The photopolymerizable compound may be treated with acid anhydride to improve developability.

The photosensitive resin composition may include the photopolymerizable compound in an amount of about 0.5 wt % to about 20 wt %, for example about 1 wt % to about 20 wt %, based on the total amount (total weight, 100 wt %) of the photosensitive resin composition. In some embodiments, the photosensitive resin composition may include the photopolymerizable compound in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the photopolymerizable compound can be in a range from about any of the foregoing amounts to about any other of the foregoing amounts.

When the photopolymerizable compound is included in an amount within the above range, a pattern edge can become clear, and developability for alkali developing solution can be improved.

(D) Photopolymerization Initiator

The photopolymerization initiator may be a generally-used photopolymerization initiator in a photosensitive resin composition. Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound include without limitation 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound include without limitation benzophenone, benzoyl benzoate, benzoyl benzoate methyl ester, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like, and combinations thereof.

Examples of the oxime-based compound include without limitation O-acyloxime-based compounds, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl] ethanone, O-ethoxycarbonyl-α-oxyamino-1-phenylpropan-1-one, and the like, and combinations thereof. Examples of the O-acyloxime-based compound include without limitation 1,2-octandione, 2-dimethylamino-2-(4-methylbenzyl)-1-(4-morpholin-4-yl-phenyl)butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate and 1-(4-phenylsulfanyl phenyl)-butan-1-oneoxime-O-acetate, and the like, and combinations thereof.

The photopolymerization initiator may further include one or more of a carbazole-based compound, a diketone-based compound, a sulfonium borate-based compound, a diazo-based compound, a imidazole-based compound, a biimidazole-based compound, and the like.

Since the photopolymerization initiator absorbs light and is excited and then transfers energy, it may be used with a photo-sensitizer causing a chemical reaction.

Examples of the photo-sensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The photosensitive resin composition may include the photopolymerization initiator in an amount of about 0.1 wt % to about 10 wt % based on the total amount (total weight, 100 wt %) of the photosensitive resin composition. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, it is possible to carry out sufficient photopolymerization upon being exposed, and deterioration of the transmittance due to non-reacted initiator can be avoided.

(E) Solvent

The solvent may be a material having compatibility with the copolymer resin, the colorant including a pigment dispersion solution, the photopolymerizable compound and the photopolymerization initiator but not reacting therewith.

Examples of the solvent may include without limitation ethylene glycol compounds such as ethylene glycol, diethylene glycol, and the like; glycol ether compounds such as ethylene glycol monomethylether, diethylene glycol monomethylether, ethylene glycol diethylether, diethylene glycol dimethylether, and the like; glycol ether acetate compounds such as ethylene glycol monoethylether acetate, diethylene glycol monoethylether acetate, diethylene glycol monobutylether acetate, and the like; propylene glycols such as propylene glycol, and the like; propylene glycol ether compounds such as propylene glycol monomethylether, propylene glycol monoethylether, propylene glycol monopropylether, propylene glycol monobutylether, propylene glycol dimethylether, dipropylene glycol dimethylether, propylene glycol diethylether, dipropylene glycol diethylether, and the like; propylene glycol ether acetate compounds such as propylene glycol monomethylether acetate, dipropylene glycol monoethylether acetate, and the like; amide compounds such as N-methyl pyrrolidone, dimethyl formamide, dimethyl acetamide, and the like; ketone compounds such as methyl ethyl ketone (MEK), methyl isobutyl ketone (MIBK), cyclohexanone, and the like; petroleum compounds such as toluene, xylene, solvent naphtha, and the like; and ester compounds such as ethyl acetate, butyl acetate, ethyl lactate, and the like. These solvents may be used singularly or as a mixture of two or more.

The solvent may be included in a balance amount, for example about 20 wt % to about 90 wt %, based on the total amount (total weight, 100 wt %) of the photosensitive resin composition. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is present in an amount within the above range, the photosensitive resin composition can have a good coating property, and flatness at a thickness of greater than or equal to 1 µm may be maintained.

(F) Other Additive(s)

The photosensitive resin composition may further include one or more additives such as but not limited to malonic acid; 3-amino-1,2-propanediol; a silane-based coupling agent including a vinyl group or a (meth)acryloxy group; a leveling agent; a fluorine-based surfactant; and/or a radical polymerization initiator, in order to prevent stains or spots during the coating, to improve leveling performance, and/or to prevent pattern residues due to non-development.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These may be used singularly or in a mixture of two or more.

The silane-based coupling agent may be included in an amount of about 0.01 parts by weight to about 10 parts by weight based on about 100 parts by weight of the photosensitive resin composition. When the silane-based coupling agent is included in an amount within the above range, close contacting properties, storage capability, and the like may be improved.

In addition, the photosensitive resin composition may further include a surfactant to improve coating and/or prevent a defect if necessary.

Examples of the surfactant may be a commercial fluorine-based surfactant such as but not limited to BM-1000® and/or BM-1100® (BM Chemie Inc.); MEGAFACE F 142D®, F 172®, F 173®, and/or F 183® (Dainippon Ink Kagaku Kogyo Co., Ltd.); FULORAD FC-135®, FULORAD FC-170C®, FULORAD FC-430®, and/or FULORAD FC-431® (Sumitomo 3M Co., Ltd.); SURFLON S-112®, SURFLON S-113®, SURFLON S-131®, SURFLON S-141®, and/or SURFLON S-145® (Asahi Glass Co., Ltd.); SH-28PA®, SH-190®, SH-193®, SZ-6032®, and/or SF-8428® (Toray Silicone Co., Ltd.), and the like, and combinations thereof.

The surfactant may be used in an amount of about 0.001 parts by weight to about 5 parts by weight based on about 100 parts by weight of the photosensitive resin composition. When the surfactant is included in an amount within the above range, excellent wetting on a glass substrate as well as coating uniformity may be secured, but a stain may not be produced.

Furthermore, the photosensitive resin composition may include one or more other additives such as but not limited to an antioxidant, a stabilizer, and the like in a predetermined amount unless they deteriorate properties of the photosensitive resin composition.

The photosensitive resin composition for a color filter of the present invention may be coated to be about 3.1 µm to about 3.4 µm thick on a bare glass substrate and a glass substrate coated to be 500 Å-thick to about 1500 Å-thick with SiNx (a protective layer) in an appropriate method such as spinning, slit coating, and the like. The coated substrate can be radiated by a light to form a pattern required for a color filter. After the radiation, the coated layer can be treated with an alkali developing solution to dissolve the unradiated part and form a pattern for a color filter. These processes can be repeated as many times as the numbers of necessary R, G, and B colors to form a color filter with a desired pattern. In addition, this image pattern may be cured by heating or radiating an actinic ray to further improve crack resistance, solvent resistance, and the like.

Another embodiment provides a light blocking layer manufactured using the photosensitive resin composition.

Another embodiment provides a color filter including the light blocking layer. A method of manufacturing the color filter is the same as described above.

Hereinafter, the present invention is illustrated in more detail with reference to the following examples. These examples, however, are not in any sense to be interpreted as limiting the scope of the invention.

Preparation of Copolymer Resin

Preparation Example 1-1

Synthesis of Copolymer Resin 50 g of YDCN-500-90P (Kukdo Chemical Co. Ltd.), 74 g of AEP (TOHO Chemical Industry Co., Ltd.), 124 g of propylene glycol monomethylacetate and 0.5 g of tetramethylammonium chloride are put in a 500 ml flask having a condenser tube and an agitator and agitated at 110° C. for 8 hours. The obtained resin is represented by the following Chemical Formula 14, and the solution has a solid concentration of 50 wt %.

[Chemical Formula 14]

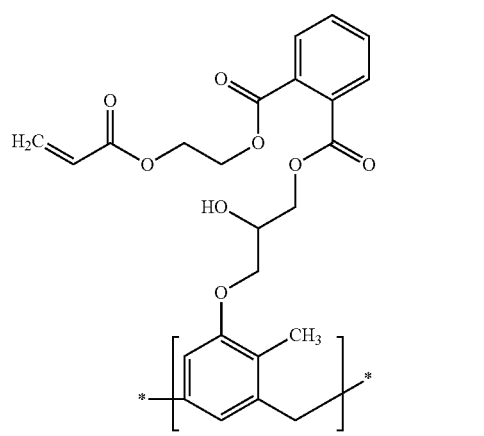

Preparation Example 1-2

Synthesis of Copolymer Resin 200 g of the solution including compound of the above Chemical Formula 14 (a solid of 50%) is put in a 500 ml flask having a condenser tube and an agitator, 17 g of 1,2,3,6-tetrahydrophthalic anhydride is added thereto, and the mixture is agitated at 100° C. for 6 hours. A copolymer resin obtained in the above method is represented by the following Chemical Formula 15 (a weight average molecular weight=13,000 g/mol, x:y=13:13), and the solution has a solid concentration of 34 wt %.

[Chemical Formula 15]

Preparation Example 1-3

Synthesis of Copolymer Resin 200 g of the solution including compound of the above Chemical Formula 14 (a solid of 50%) is put in a 500 ml flask having a condenser tube and an agitator, 11 g of maleic anhydride is added thereto, and the mixture is agitated at 100° C. for 6 hours. A copolymer resin obtained in the above method is represented by the following Chemical Formula 16 (a weight average molecular weight=13,000 g/mol, x:y=13:13), and the solution has a solid concentration of 34 wt %.

[Chemical Formula 16]

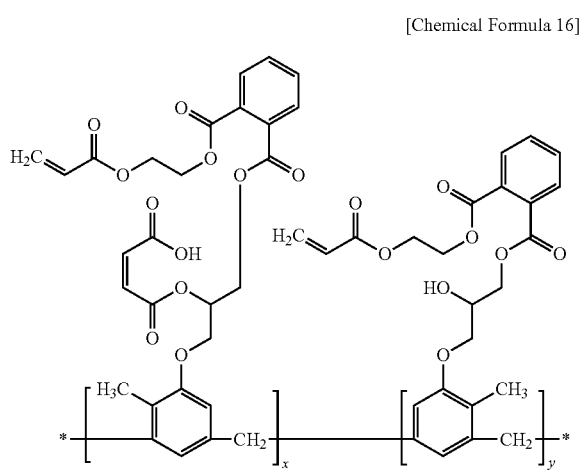

Preparation Example 1-4

Synthesis of Copolymer Resin 200 g of the solution including compound of the above Chemical Formula 14 (a solid of 50%) is put in a 500 ml flask having a condenser tube and an agitator, 21 g of 1,2,4-benzenetricarboxylic acid anhydride is added thereto, and the mixture is agitated at 100° C. for 6 hours. A copolymer resin obtained in the above method is represented by the following Chemical Formula 17 (a weight average molecular weight=13,500 g/mol, x:y=13:13), and the solution has a solid concentration of 34 wt %.

[Chemical Formula 17]

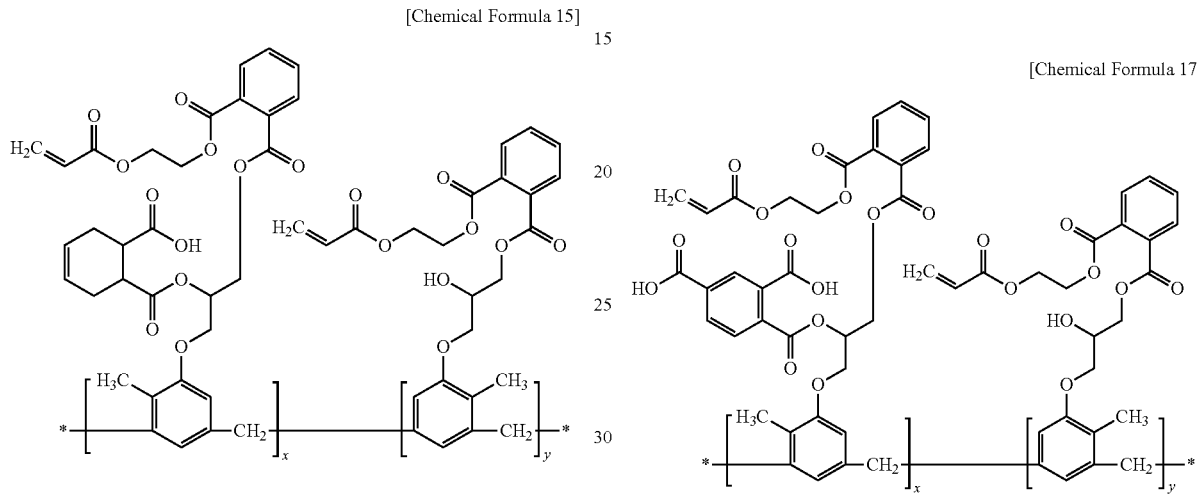

Preparation of Pigment Dispersion Solution

Preparation Example 2

Preparation of Pigment Dispersion Solution 9.2 g of a blue pigment (TDB-1, DNS), 0.8 g of a violet pigment (RL-01, Clariant), 2.4 g of a dispersing agent (BYK 6919, BYK), 5.4 g of a binder resin (V259ME, NSCC) and 30.0 g of propylene glycol methylethylacetate are mixed in a reactor, and the mixture is dispersed for 12 hours by using a paint-shaker (Asada), preparing a pigment dispersion solution.

Preparation of Photosensitive Resin Composition

Examples 1 to 3 and Comparative Examples 1 to 3

Each photosensitive resin composition according to Examples 1 to 3 and Comparative Examples 1 to 3 is prepared to have a composition in the following Table 1 by using the following components.

Specifically, an initiator is dissolved in a solvent for 2 hours, the solution is agitated at room temperature, the copolymer resin and photopolymerizable initiators according to Preparation Examples 1-2 to 1-4 are respectively added thereto, and the mixture is agitated at room temperature for 2 hours. Subsequently, the pigment dispersion solution according to Preparation Example 2 and a fluorine-based surfactant are added to the reactant, and the mixture is agitated at room temperature for 1 hour. Subsequently, the product is three times filtered to remove impurities, preparing a photosensitive resin composition.

(A) Copolymer Resin (A-1) A compound represented by Chemical Formula 15 according to Preparation Example 1-2 is used.

(A-2) A compound represented by Chemical Formula 16 according to Preparation Example 1-3 is used.

(A-3) A compound represented by Chemical Formula 17 according to Preparation Example 1-4 is used.

(A-4) KAYARAD CCR-1171H made by Nippon Kayaku Co., Ltd, is used.

(A-5) V259ME made by NSCC is used.

(A-6) CF-9007 made by WAKO is used.

(B) Pigment Dispersion Solution

The pigment dispersion solution according to Preparation Example 2 is used.

(C) Photopolymerizable Compound

Dipentaerythritol hexaacrylate is used.

(D) Photopolymerization Initiator

IRGACURE OXE02 made by Ciba Specialty Chemicals Ltd. is used.

(E) Solvent

A mixed solvent obtained by mixing 21 g of propylene glycol methylether acetate and 20.8 g of ethylethoxy propionate is used.

(F) Additive

F-475 (DIC Co., Ltd.) is used as a fluorine-based surfactant.

TABLE 1

(unit: wt %)

| | | Example | | | Comparative Example | | |
|---|---|---|---|---|---|---|---|
| | | 1 | 2 | 3 | 1 | 2 | 3 |
| (A) copolymer resin | A-1 | 6.0 | — | — | — | — | — |
| | A-2 | — | 6.0 | — | — | — | — |
| | A-3 | — | — | 6.0 | — | — | — |
| | A-4 | — | — | — | 6.0 | — | — |
| | A-5 | — | — | — | — | 6.0 | — |
| | A-6 | — | — | — | — | — | 6.0 |
| (B) pigment dispersion solution | | 47.8 | 47.8 | 47.8 | 47.8 | 47.8 | 47.8 |
| (C) photopolymerizable compound | | 4.1 | 4.1 | 4.1 | 4.1 | 4.1 | 4.1 |
| (D) photopolymerization initiator | | 0.2 | 0.2 | 0.2 | 0.2 | 0.2 | 0.2 |
| (E) solvent | | 41.8 | 41.8 | 41.8 | 41.8 | 41.8 | 41.8 |
| (F) additive | | 0.1 | 0.1 | 0.1 | 0.1 | 0.1 | 0.1 |

Evaluation 1: Sensitivity

Sensitivity is evaluated by using the photosensitive resin compositions according to Examples 1 to 3 and Comparative Examples 1 to 3.

The photosensitive resin compositions according to Examples 1 to 3 and Comparative Examples 1 to 3 are respectively coated to be 3 μm thick on a transparent circular glass substrate (a bare glass) by using a spin-coater (K-Spin8, KDNS). The coated photosensitive resin compositions are soft-baked on a hot-plate at 80° C. for 150 seconds, exposed with 60 mJ of output (power) by using an exposer (I10C, Nikon Co.), and then, developed at 25° C. for 60 seconds by using a developer, washed for 60 seconds, and spin-dried for 25 seconds. Herein, a potassium hydroxide aqueous solution with a concentration of 1 wt % is used as a developing solution. Then, the width of patterns formed using a 10 μm mask is measured by using an optical microscope after hard-baking at 230° C. in an oven for 30 minutes. The results are provided in the following Table 2.

TABLE 2

| | Example 1 | Example 2 | Example 3 | Comparative Example 1 | Comparative Example 2 | Comparative Example 3 |
|---|---|---|---|---|---|---|
| Actual width of 10 μm pattern (μm) | 11.6 | 10.4 | 11.2 | 9.8 | 10.3 | 8.3 |

Evaluation 2: Heat Resistance

Heat resistance is evaluated by using the photosensitive resin compositions according to Examples 1 to 3 and Comparative Examples 1 to 3.

The photosensitive resin compositions according to Examples 1 to 3 and Comparative Examples 1 to 3 are respectively coated to be 3 μm thick on a transparent circular glass substrate (a bare glass) by using a spin-coater (K-Spin 8, KDNS. The coated photosensitive resin compositions are soft-baked at 80° C. for 150 seconds on a hot-plate, exposed with 60 mJ of an output (power) by using an exposer (I10C, Nikon Inc.), developed at 25° C. for 60 seconds, washed for 60 seconds, and spin-dried for 25 seconds. Herein, a potassium hydroxide aqueous solution with 1 wt % of a concentration is used as a developing solution. Then, the color of the photosensitive resin compositions is measured after hard-baking at 230° C. in an oven for 30 minutes, their color change is measured by using a spectrophotometer (MCPD3000, Otsuka Electronics Co., Ltd.) after baking again at 230° C. in the oven for 2 hours, and the results are provided in the following Table 3.

<Heat Resistance Evaluation Reference>

ΔE<3 after treatment at 230° C. in an oven for 2 hours: Excellent

3≤ΔE<6 after treatment at 230° C. in an oven for 2 hours: insufficient

ΔE≥6 after treatment at 230° C. in an oven for 2 hours: inferior

Evaluation 3: Shrinkage Ratio

A shrinkage ratio is evaluated by using the photosensitive resin compositions according to Examples 1 to 3 and Comparative Examples 1 to 3.

The photosensitive resin compositions according to Examples 1 to 3 and Comparative Examples 1 to 3 are respectively coated to be 3 μm thick on a transparent circular glass substrate (a bare glass) by using a spin-coater (K-Spin 8, KDNS). The coated photosensitive resin compositions are soft-baked at 80° C. for 150 seconds by using an exposer (I10C, Nikon Inc.), exposed with 60 mJ of an output (power), developed at room temperature of 25° C. for 60 seconds, washed for 60 seconds and spin-dried for 25 seconds. Herein, a potassium hydroxide aqueous solution with 1 wt % of a concentration is used as a developing solution. Then, the shrinkage ratio of the photosensitive resin compositions is calculated as a difference before and after hard-baking at 230° C. in an oven for 30 minutes, and the results are provided in the following Table 3.

TABLE 3

|  | Heat resistance | Shrinkage ratio (%) |
|---|---|---|
| Example 1 | excellent | 3 |
| Example 2 | excellent | 5 |
| Example 3 | excellent | 3 |
| Comparative Example 1 | insufficient | 9 |
| Comparative Example 2 | insufficient | 8 |
| Comparative Example 3 | inferior | 12 |

Referring to Table 2, the photosensitive resin compositions of Examples 1 to 3 prepared by using the copolymer resins of Preparation Examples 1-2 to 1-4 respectively exhibit excellent sensitivity compared with the photosensitive resin compositions of Comparative Examples 1 to 3 when the width of the patterns is compared under the same raw material and exposure dose.

In addition, referring to Table 3, the photosensitive resin compositions of Examples 1 to 3 exhibit excellent heat resistance and shrinkage resistance compared with the photosensitive resin compositions of Comparative Examples 1 to 3.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A photosensitive resin composition, comprising:
(A) a copolymer resin represented by the following Chemical Formula 1;
(B) a colorant including a pigment dispersion solution;
(C) a photopolymerizable compound;
(D) a photopolymerization initiator; and
(E) a solvent:

[Chemical Formula 1]

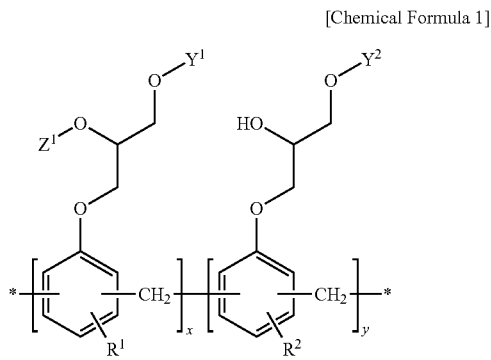

wherein, in the above Chemical Formula 1,
$R^1$ and $R^2$ are the same or different and are each independently hydrogen or substituted or unsubstituted C1 to C20 alkyl,
$Y^1$ and $Y^2$ are the same or different and are each independently represented by the following Chemical Formula 2-1,
$Z^1$ is represented by the following Chemical Formula 2-2,
x is an integer ranging from 1 to 200, y is an integer ranging from 1 to 200, x+y≥2,

[Chemical Formula 2-1]

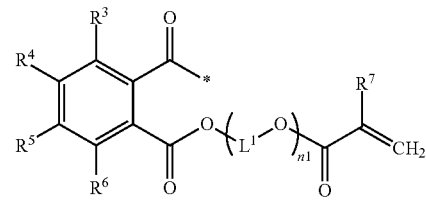

wherein, in the above Chemical Formula 2-1,
$R^3$ to $R^6$ are the same or different and are each independently hydrogen, halogen, a hydroxy group, a cyano group, substituted or unsubstituted C1 to C20 alkyl, a carboxyl group, a nitro group, a sulfonyl group, or a combination thereof,
$R^7$ is hydrogen or substituted or unsubstituted C1 to C20 alkyl,
$L^1$ is substituted or unsubstituted C1 to C20 alkylene, and
n1 is an integer ranging from 1 to 12,

[Chemical Formula 2-2]

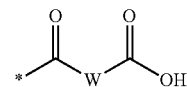

wherein, in the above Chemical Formula 2-2,
W is substituted or unsubstituted C1 to C20 alkylene, substituted or unsubstituted C2 to C20 alkenylene, substituted or unsubstituted C1 to C20 heteroalkylene, substituted or unsubstituted C3 to C20 cycloalkylene, substituted or unsubstituted C4 to C20 cycloalkenylene, substituted or unsubstituted C2 to C20 hetero cycloalkylene, substituted or unsubstituted C2 to C20 hetero cycloalkenylene, or substituted or unsubstituted C6 to C20 arylene.

2. The photosensitive resin composition of claim 1, wherein $Z^1$ is represented by one of the following Chemical Formula 3 to Chemical Formula 9:

[Chemical Formula 3]

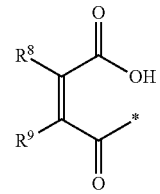

[Chemical Formula 4]

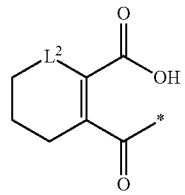

[Chemical Formula 5]

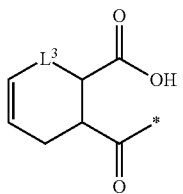

[Chemical Formula 6]

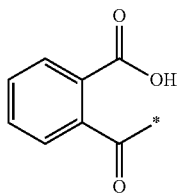

[Chemical Formula 7]

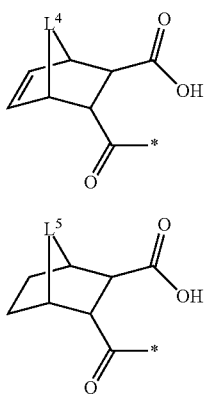

[Chemical Formula 8]

[Chemical Formula 9]

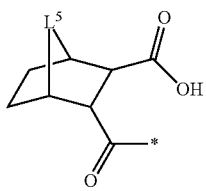

wherein, in the above Chemical Formula 3 to Chemical Formula 9, $R^8$ and $R^9$ are the same or different and are each independently hydrogen, substituted or unsubstituted C1 to C20 alkyl, —C(=O)O$R^{10}$ wherein $R^{10}$ is hydrogen or substituted or unsubstituted C1 to C10 alkyl, —O$R^{11}$ wherein $R^{11}$ is hydrogen or substituted or unsubstituted C1 to C10 alkyl, or a combination thereof, $L^2$ to $L^6$ are the same or different and are each independently a single bond, —O—, —S—, —NH—, or substituted or unsubstituted C1 to C20 alkylene.

3. The photosensitive resin composition of claim 2, wherein $Z^1$ is represented by Chemical Formula 3, Chemical Formula 5, or Chemical Formula 6.

4. The photosensitive resin composition of claim 1, wherein the copolymer resin has a weight average molecular weight of about 3,000 g/mol to about 500,000 g/mol.

5. The photosensitive resin composition of claim 1, wherein the copolymer resin has an acid value of about 20 mgKOH/g to about 200 mgKOH/g.

6. The photosensitive resin composition of claim 1, wherein the photosensitive resin composition further comprises a cardo-based resin, an acrylic-based resin, or a combination thereof.

7. The photosensitive resin composition of claim 6, wherein the cardo-based resin comprises a repeating unit represented by the following Chemical Formula 10 and Chemical Formula 11:

[Chemical Formula 10]

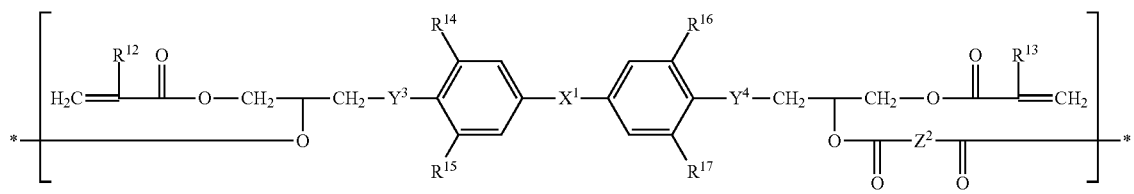

[Chemical Formula 11]

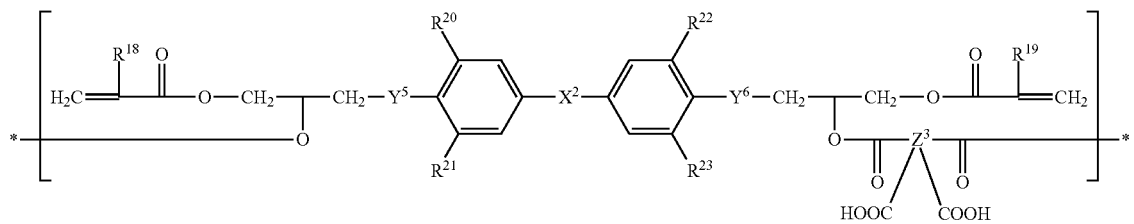

wherein, in the above Chemical Formula 10 and Chemical Formula 11, $R^{12}$, $R^{13}$, $R^{18}$ and $R^{19}$ are the same or different and are each independently hydrogen or substituted or unsubstituted C1 to C20 alkyl, $R^{14}$ to $R^{17}$ and $R^{20}$ to $R^{23}$ are the same or different and are each independently hydrogen, halogen, or substituted or unsubstituted C1 to C20 alkyl, $X^1$ and $X^2$ are the same or different and are each independently represented by one of the following Chemical Formula a to Chemical Formula I, $Y^3$ to $Y^6$ are the same or different and are each independently a single bond, —O—, —NR$^{24}$— wherein R$^{24}$ is hydrogen, methyl, ethyl, CH$_2$OH, C$_2$H$_4$OH or CH$_2$CH=CH$_2$, or —C(=O)O—, each $Z^2$ is independently a residual group of acid anhydride, and each $Z^3$ is independently a residual group of acid dianhydride,

[Chemical Formula a]

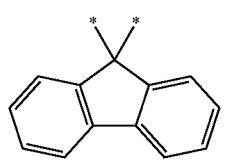

[Chemical Formula b]

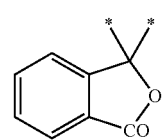

[Chemical Formula c]

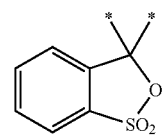

[Chemical Formula d]

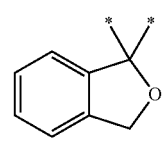

[Chemical Formula e]

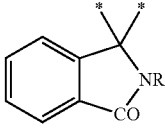

wherein, in the above Chemical Formula e, $R^a$ is hydrogen, ethyl, C$_2$H$_4$Cl, C$_2$H$_4$OH, CH$_2$CH=CH$_2$, or phenyl,

[Chemical Formula f]

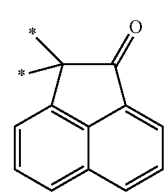

[Chemical Formula g]

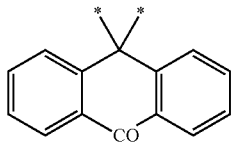

[Chemical Formula h]

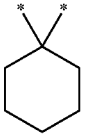

[Chemical Formula i]

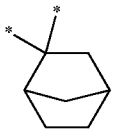

[Chemical Formula j]

[Chemical Formula k]

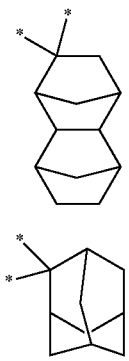

[Chemical Formula l]

8. The photosensitive resin composition of claim 6, wherein the cardo-based resin has a weight average molecular weight of about 500 g/mol to about 30,000 g/mol.

9. The photosensitive resin composition of claim 1, wherein the colorant further comprises a dye.

10. The photosensitive resin composition of claim 1, wherein the photosensitive resin composition comprises:
about 1 wt % to about 50 wt % of the copolymer resin (A) represented by the Chemical Formula 1;
about 1 wt % to about 60 wt % of the colorant (B) including a pigment dispersion solution;
about 0.5 wt % to about 20 wt % of the photopolymerizable compound (C);
about 0.1 wt % to about 10 wt % of the photopolymerization initiator (D); and
a balance amount of the solvent (E).

11. The photosensitive resin composition of claim 1, wherein the photosensitive resin composition further comprises malonic acid; 3-amino-1,2-propanediol; a silane-based coupling agent having a vinyl group or a (meth)acryloxy group; a leveling agent; a fluorine-based surfactant; a radical polymerization initiator; or a mixture thereof.

12. A light blocking layer manufactured using the photosensitive resin composition of claim 1.

13. A color filter comprising the light blocking layer of claim 12.

* * * * *